United States Patent
Cho et al.

(10) Patent No.: US 10,804,217 B2
(45) Date of Patent: Oct. 13, 2020

(54) EMI SHIELDING FOR FLIP CHIP PACKAGE WITH EXPOSED DIE BACKSIDE

(71) Applicant: STATS ChipPAC Pte. Ltd., Singapore (SG)

(72) Inventors: SungWon Cho, Seoul (KR); ChangOh Kim, Incheon (KR); Il Kwon Shim, Singapore (SG); InSang Yoon, Seoul (KR); KyoungHee Park, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 16/529,486

(22) Filed: Aug. 1, 2019

(65) Prior Publication Data
US 2020/0051926 A1  Feb. 13, 2020

Related U.S. Application Data

(60) Provisional application No. 62/717,415, filed on Aug. 10, 2018.

(51) Int. Cl.
| | |
|---|---|
| *H01L 27/14* | (2006.01) |
| *H01L 21/00* | (2006.01) |
| *H01L 23/552* | (2006.01) |
| *H01L 23/00* | (2006.01) |
| *H01L 23/36* | (2006.01) |

(Continued)

(52) U.S. Cl.
CPC ........ *H01L 23/552* (2013.01); *H01L 23/3107* (2013.01); *H01L 23/36* (2013.01); *H01L 23/49816* (2013.01); *H01L 23/50* (2013.01); *H01L 23/5225* (2013.01);
(Continued)

(58) Field of Classification Search
CPC ....... H01L 23/552; H01L 24/26; H01L 23/36; H01L 23/50; H01L 23/49816; H01L 2924/3025; H01L 2924/15311; H01L 23/31; H01L 23/60; H01L 23/3107; H01L 23/562; H01L 27/0248
See application file for complete search history.

(56) References Cited

U.S. PATENT DOCUMENTS 10,256,195 B2 * 4/2019 Yamamoto ............ H01L 23/552
10,455,748 B2 * 10/2019 Yamamoto ................ B32B 7/12
(Continued)

OTHER PUBLICATIONS

"EMI Shielding for Die Backside Exposed Flip Chip Package", ip.com, Jun. 12, 2017.

*Primary Examiner* — Alonzo Chambliss
(74) *Attorney, Agent, or Firm* — Brian M. Kaufman; Robert D. Atkins; Patent Law Group: Atkins and Associates, P.C.

(57) ABSTRACT

A semiconductor device has a substrate and a semiconductor die disposed over the substrate. An encapsulant is deposited over the semiconductor die and substrate with a surface of the semiconductor die exposed from the encapsulant. A first shielding layer is formed over the semiconductor die. In some embodiments, the first shielding layer includes a stainless steel layer in contact with the surface of the semiconductor die and a copper layer formed over the stainless steel layer. The first shielding layer may further include a protective layer formed over the copper layer. One embodiment has a heatsink bonded to the semiconductor die through a solder layer. A second shielding layer can be formed over a side surface of the semiconductor die.

22 Claims, 15 Drawing Sheets

(51) Int. Cl.

| | |
|---|---|
| *H01L 23/522* | (2006.01) |
| *H01L 23/50* | (2006.01) |
| *H01L 23/60* | (2006.01) |
| *H01L 23/498* | (2006.01) |
| *H01L 27/02* | (2006.01) |
| *H01L 23/31* | (2006.01) |

(52) U.S. Cl.
CPC ............ *H01L 23/562* (2013.01); *H01L 23/60* (2013.01); *H01L 24/26* (2013.01); *H01L 27/0248* (2013.01)

(56) References Cited

U.S. PATENT DOCUMENTS

| | | | |
|---|---|---|---|
| 2004/0053443 A1* | 3/2004 | Kumamoto | H01L 21/4832 438/106 |
| 2009/0321118 A1* | 12/2009 | Kim | H01L 23/5389 174/260 |
| 2010/0289131 A1* | 11/2010 | Bathan | H01L 21/56 257/686 |
| 2012/0211876 A1* | 8/2012 | Huang | H01L 23/552 257/660 |
| 2013/0075879 A1* | 3/2013 | Yang | H01L 23/552 257/659 |
| 2014/0225236 A1* | 8/2014 | Kim | H01L 24/97 257/659 |
| 2016/0027740 A1* | 1/2016 | Chiu | H01L 21/4853 257/659 |
| 2016/0276288 A1* | 9/2016 | Lee | H01L 23/552 |
| 2016/0276307 A1* | 9/2016 | Lin | H01L 23/552 |
| 2017/0103953 A1* | 4/2017 | Chiu | H01L 23/3128 |
| 2018/0108618 A1* | 4/2018 | Yamamoto | C23C 14/24 |
| 2019/0139902 A1* | 5/2019 | Lee | H01L 21/6836 |
| 2019/0341352 A1* | 11/2019 | We | H01L 21/78 |

* cited by examiner

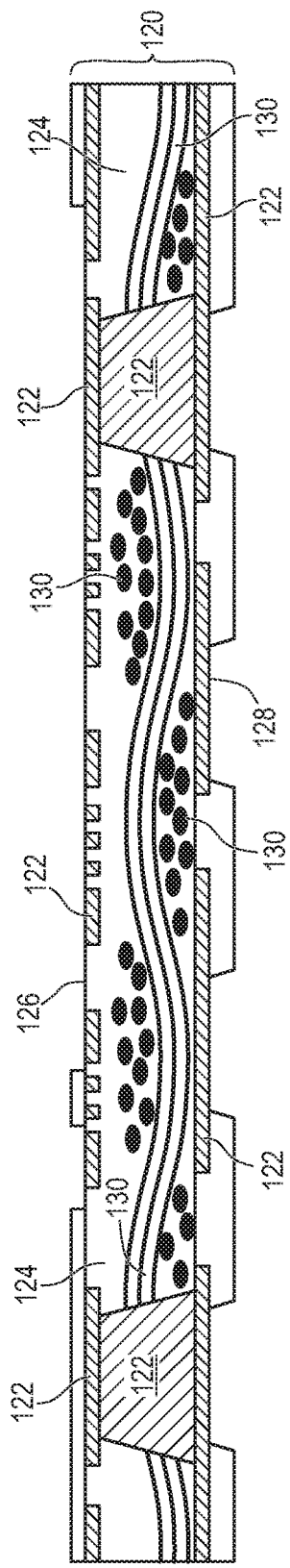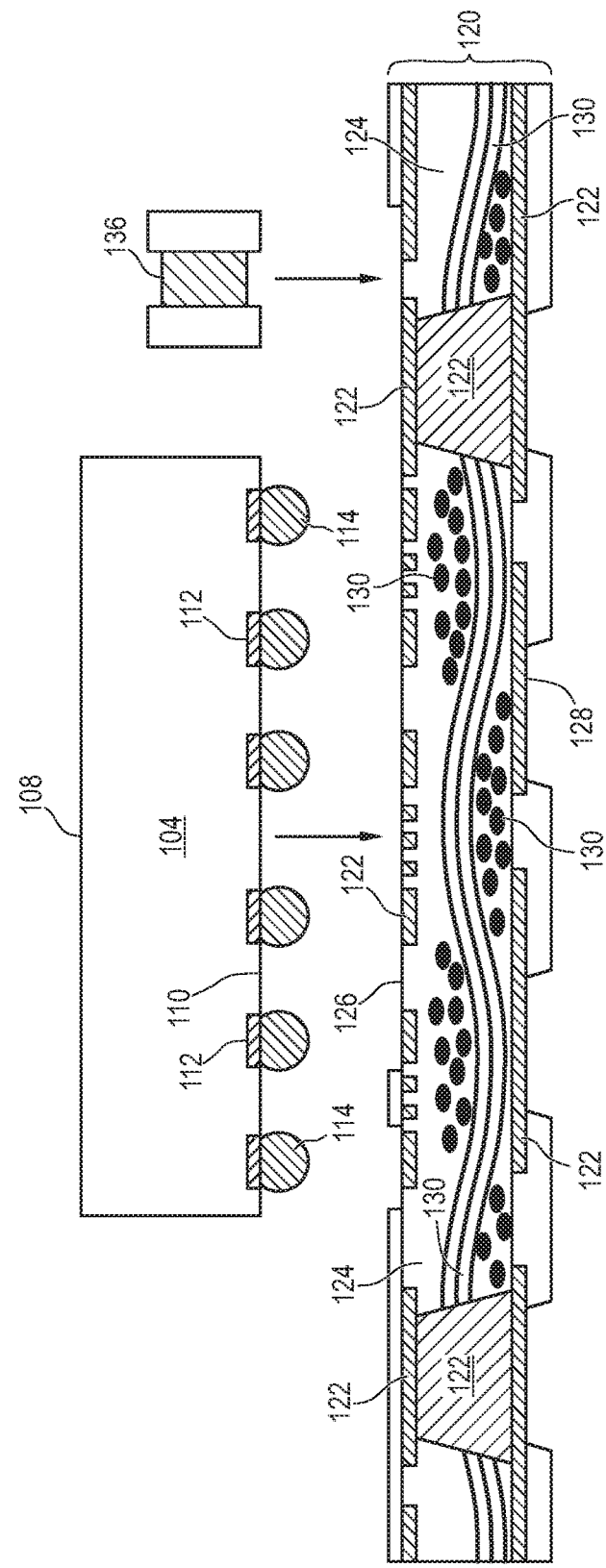

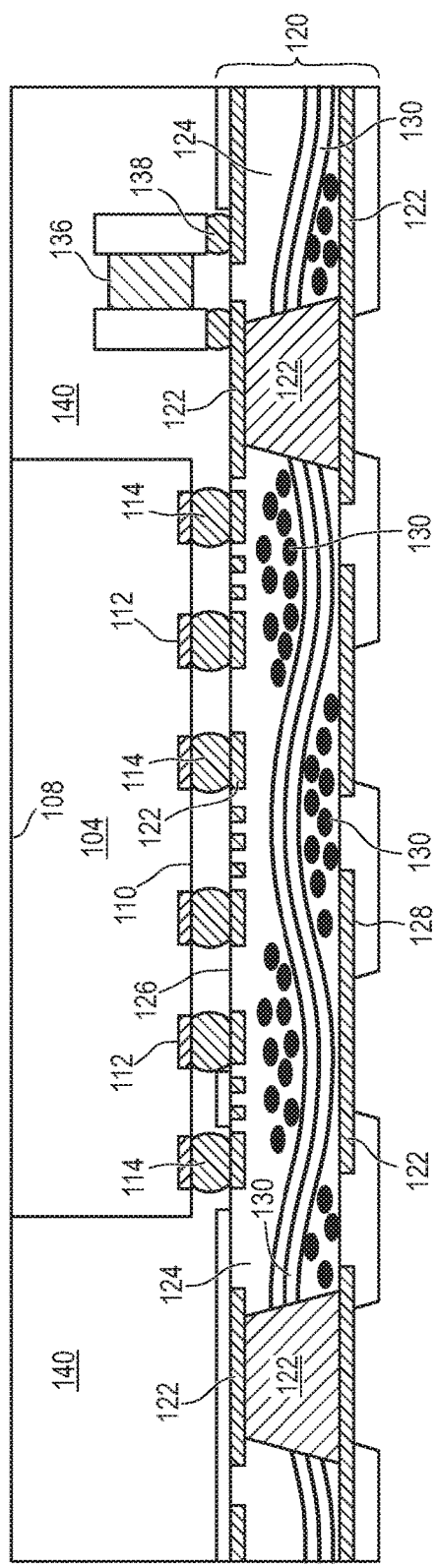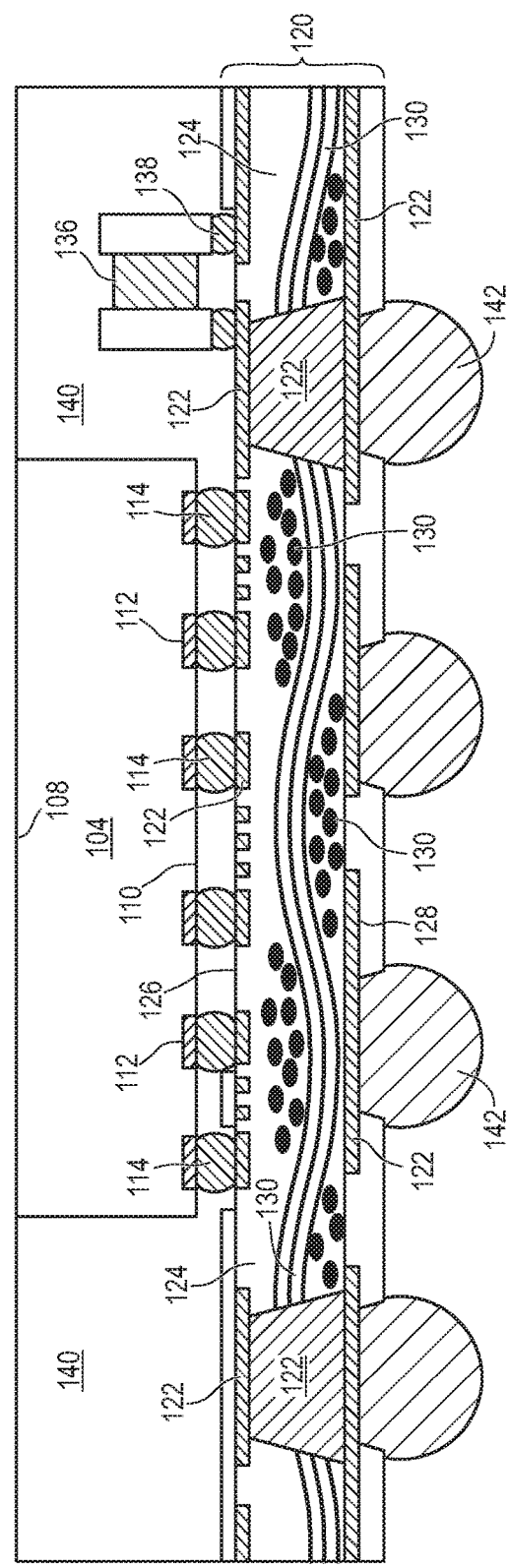

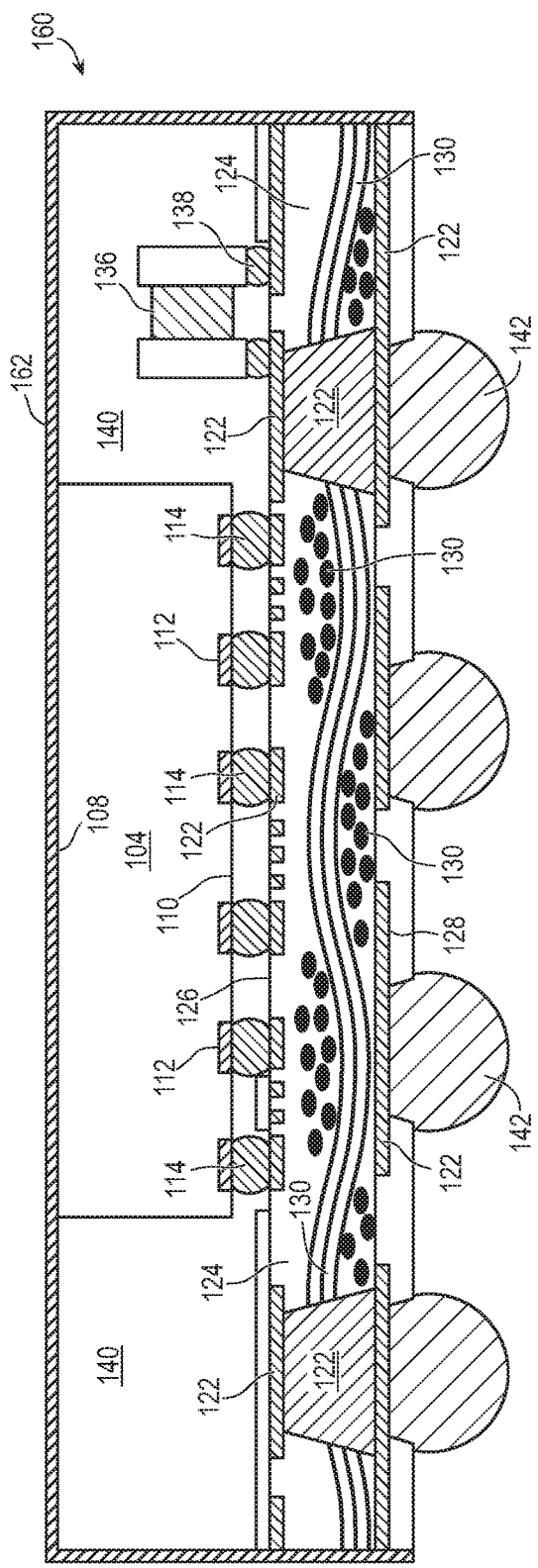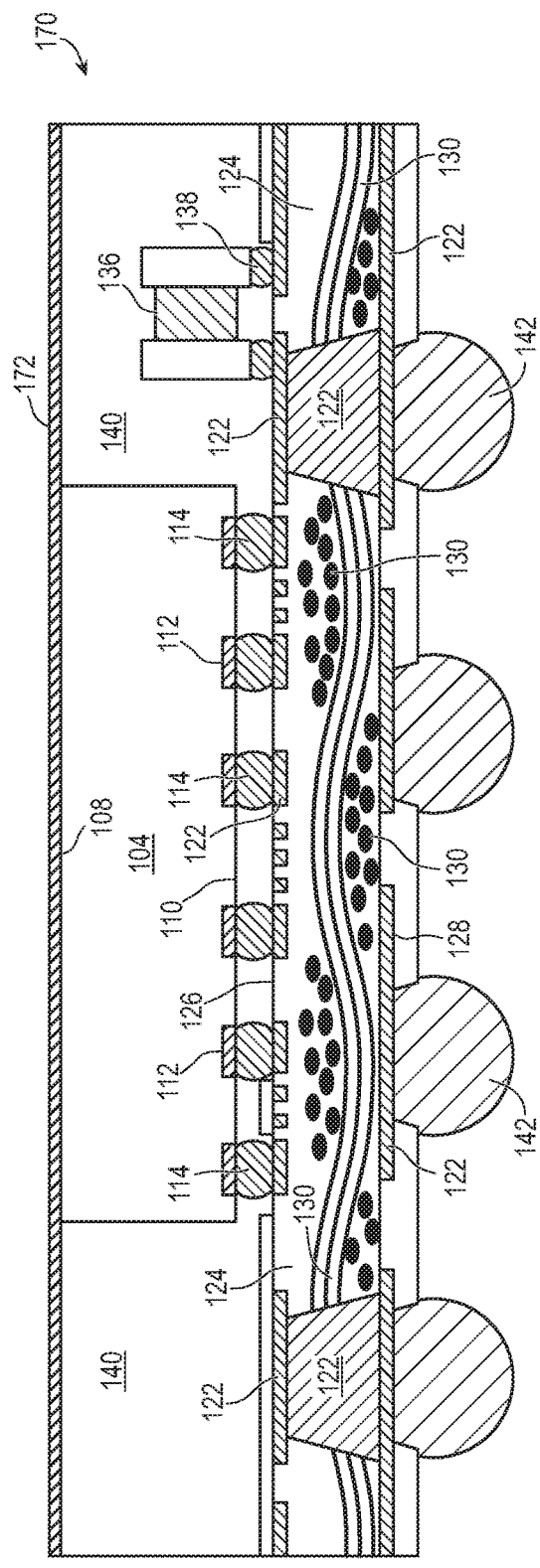

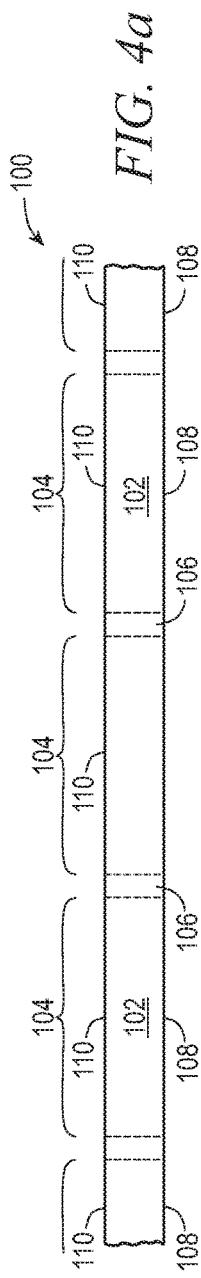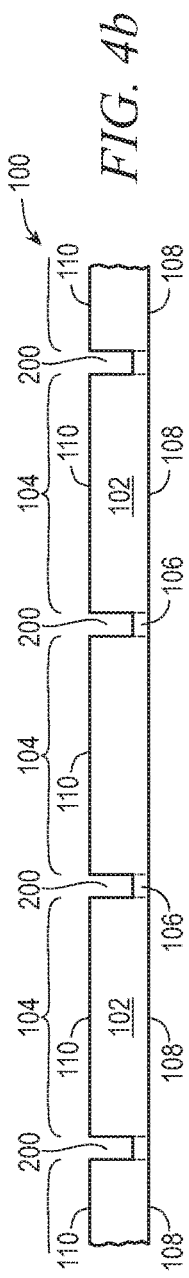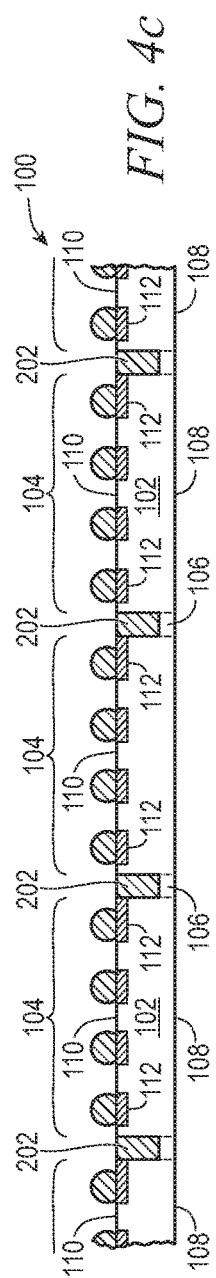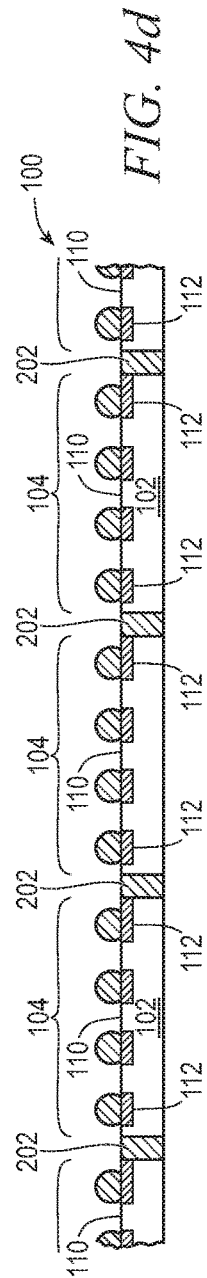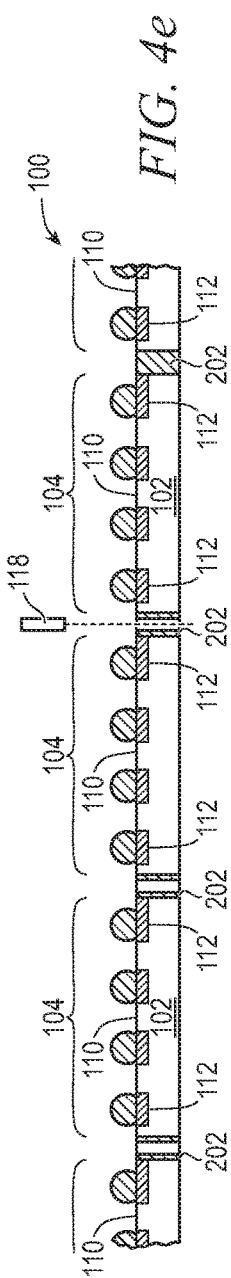

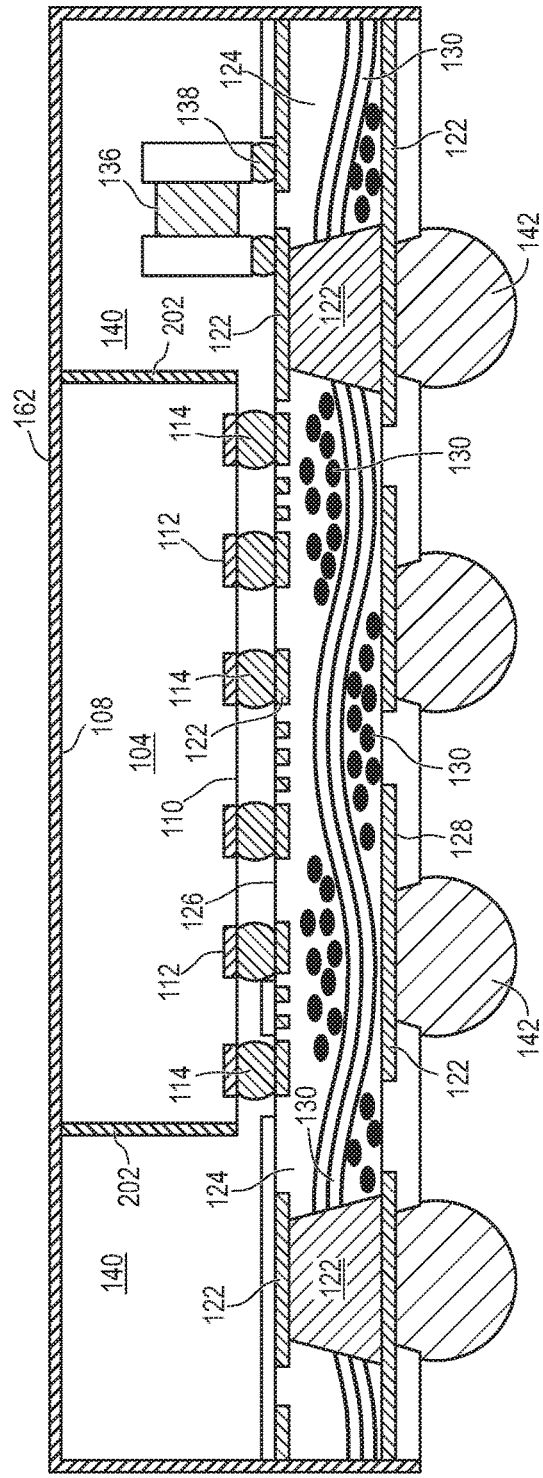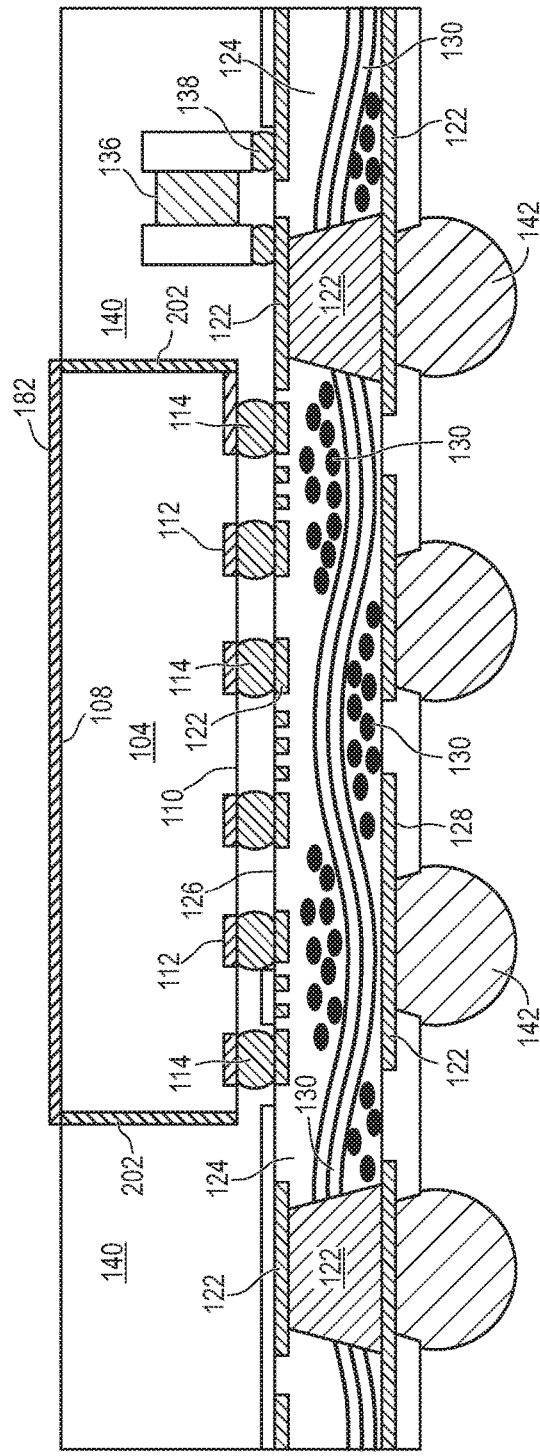

EMI SHIELDING FOR FLIP CHIP PACKAGE WITH EXPOSED DIE BACKSIDE

CLAIM OF DOMESTIC PRIORITY

The present application claims the benefit of U.S. Provisional Application No. 62/717,415, filed Aug. 10, 2018, which application is incorporated herein by reference.

FIELD OF THE INVENTION

The present invention relates in general to semiconductor devices and, more particularly, to semiconductor packages with electromagnetic interference (EMI) shielding formed over an exposed die backside.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. The high-speed switching of digital circuits also generates interference.

Conductive layers are commonly formed over semiconductor packages to shield electronic parts within the package from EMI and other interference. Shielding layers absorb EMI before the signals can hit semiconductor die and discrete components within the package, which might otherwise cause malfunction of the device. Shielding layers are also formed over packages with components that are expected to generate EMI to protect nearby devices from malfunction.

Many factors can make proper EMI shielding difficult. Many prior art shielding methods do not allow sufficient thermal dissipation and are unable to produce a semiconductor package with a low enough profile to meet the demands of today's consumers. Therefore, a need exists for improvements to EMI shielding and manufacturing methods.

BRIEF DESCRIPTION OF THE DRAWINGS

FIGS. 2a-2d illustrate forming a flip chip package with an exposed semiconductor die backside;

FIGS. 3a-3c illustrate a shielding layer formed over the flip chip package;

FIGS. 4a-4e illustrate forming EMI shielding layers over side surfaces of the semiconductor die;

FIGS. 5a and 5b illustrate embodiments of the flip chip package with the semiconductor die having side surface EMI shielding;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form, and, accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
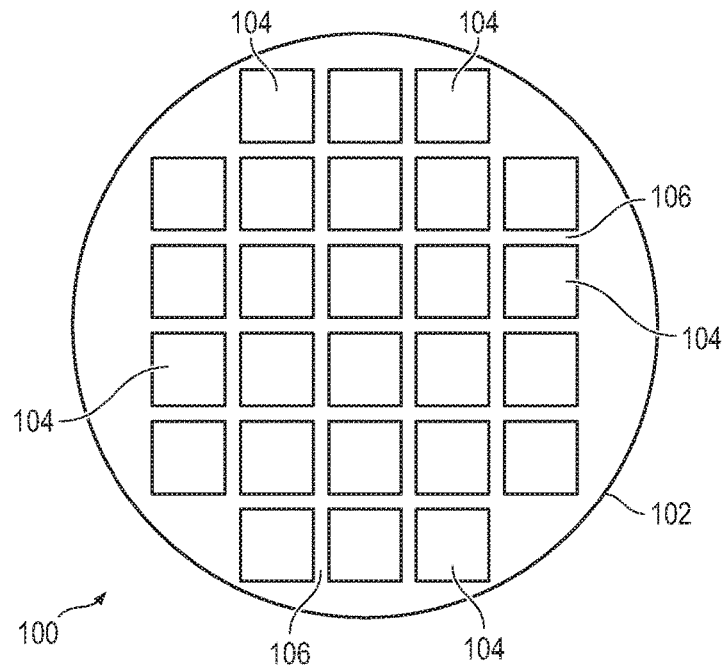
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
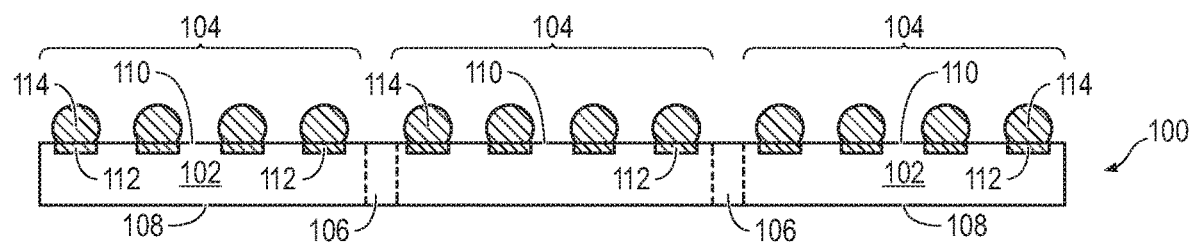

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as a digital signal processor (DSP), application specific integrated circuit (ASIC), memory, or other signal processing circuit. Semiconductor die 104 may also contain IPDs, such as inductors, capacitors, and resistors formed in or on interconnect layers over surfaces of the semiconductor die for RF signal processing.

An electrically conductive layer 112 is formed over active surface 110 using PVD, CVD, electrolytic plating, electroless plating, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits of active surface 110 and may include conductive traces for horizontal routing.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In some embodiments, the bump material is reflowed by heating the material above its melting point to form balls or bumps 114. In one embodiment, bump 114 is formed over an under bump metallization (UBM) having a wetting layer, a barrier layer, and an adhesion layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
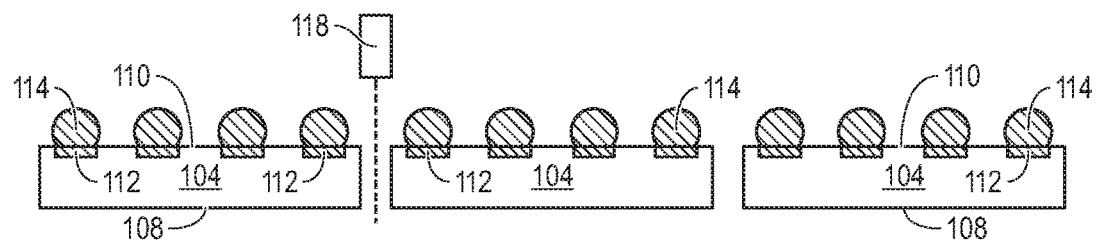

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die (KGD) after singulation.

FIGS. 2a-2d illustrate a process of forming a flip chip package with an exposed semiconductor die backside. FIG. 2a shows a cross-sectional view of substrate 120 including conductive layers 122 and insulating layer 124. Conductive layers 122 can be one or more layers of Al, Cu, Sn, Ni, Au, Ag, or other suitable electrically conductive material. Conductive layers 122 include conductive traces for horizontal electrical interconnect across substrate 120, contact pads for interconnection to other devices, and conductive vias for vertical electrical interconnect between surface 126 and surface 128 of the substrate.

Portions of conductive layers 122 can be electrically common or electrically isolated depending on the design and function of semiconductor die 104. Insulating layer 124 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), solder resist, polyimide, benzocyclobutene (BCB), polybenzoxazoles (PBO), and other material having similar insulating and structural properties. Insulating layer 124 provides isolation between conductive layers 122. Substrate 120 further includes core material 130, such as glass fabric, to reinforce the substrate and reduce warpage.

In FIG. 2b, semiconductor die 104 from FIG. 1c is positioned over substrate 120 using a pick and place operation with active surface 110 and bumps 114 oriented toward surface 126. Discrete component 136 is also positioned over surface 126 of substrate 120. In one embodiment, discrete component 136 is a discrete active device such as a diode, transistor, or voltage regulator, or a discrete passive device such as a resistor, capacitor, inductor, or an RF filter. Any combination of active and passive devices can be disposed on substrate 120 along with semiconductor die 104 to implement a desired electrical functionality.

FIG. 2c shows semiconductor die 104 bonded to a first portion of conductive layer 122 by reflowing bumps 114. Discrete component 136 is bonded to another portion of conductive layer 122 of substrate 120 with solder bumps or conductive paste 138.

In FIG. 2c, an encapsulant or molding compound 140 is deposited over substrate 120, semiconductor die 104, and discrete electrical device 136 using a paste printing, compressive molding, transfer molding, liquid encapsulant molding, vacuum lamination, spin coating, or another suitable applicator. Encapsulant 140 can be polymer composite material, such as epoxy resin, epoxy acrylate, or polymer with or without a filler. Encapsulant 140 is non-conductive, provides structural support, and environmentally protects the semiconductor device from external elements and contaminants.

Encapsulant 140 is deposited with back surface 108 of semiconductor die 104 exposed from the encapsulant. A back surface of encapsulant 140 is coplanar with back surface 108 of semiconductor die 104. In some embodiments, encapsulant 140 is deposited with a mold plate in contact with back surface 108, using film assisted molding, or by another suitable molding process to keep the top of semiconductor die 104 free from encapsulant 140. In other embodiments, encapsulant 140 is deposited covering semiconductor die 104 and then backgrinded to expose back surface 108.

In FIG. 2d, an electrically conductive bump material is deposited over conductive layer 122 on surface 128 of substrate 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 142. In some embodiments, bump 142 is formed over a UBM having a wetting layer, barrier layer, and adhesion layer. Bump 142 can also be compression bonded or thermocompression bonded to conductive layer 122. Bump 142 represents one type of interconnect structure that can be formed over conductive layer 122. The interconnect structure can also use bond wires, conductive paste, stud bump, micro bump, or other electrical interconnect. In another embodiment, conductive layer 122 remains exposed as a land grid array without an additional interconnect structure. Bumps 142 are electrically connected to semiconductor die 104 and discrete component 136 by conductive layers 122, bumps 114, and solder paste 138.

Figure 3C:
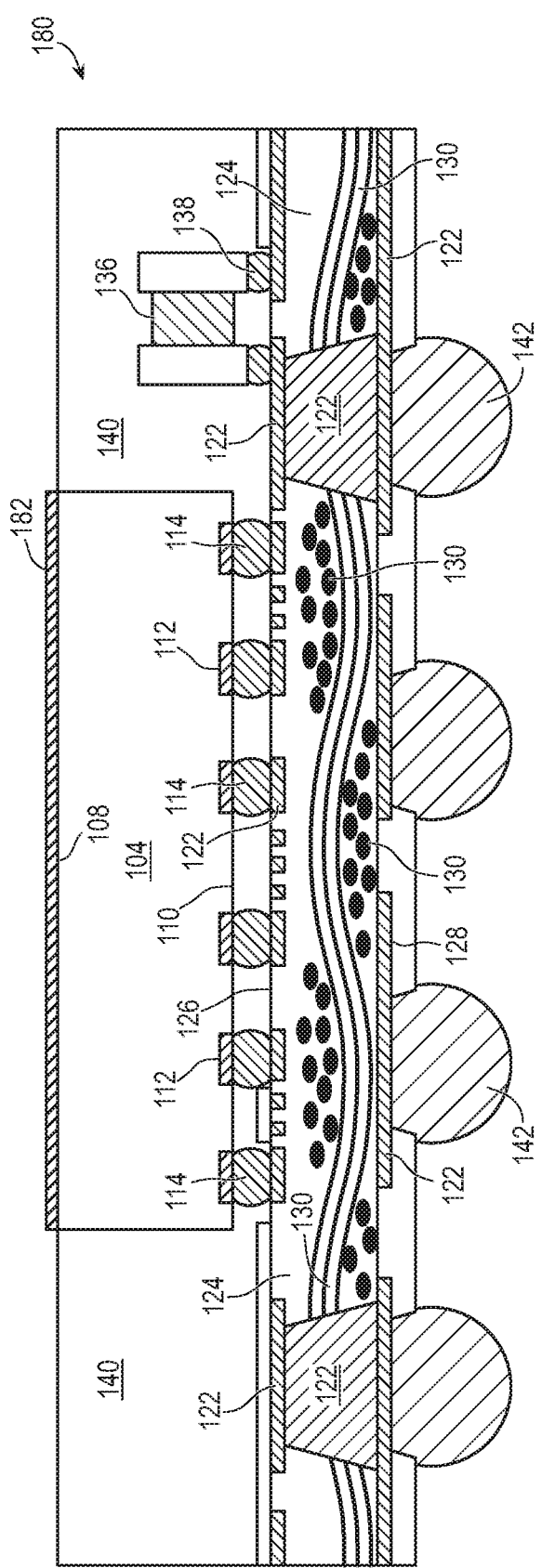

FIGS. 3a-3c illustrate an EMI shielding layer formed over the flip chip package from FIG. 2d. FIG. 3a shows package 160 with EMI shielding layer 162 formed over the top and side surfaces of the package. Typically, semiconductor package 160 is formed as part of a sheet of numerous identical packages. The sheet of devices can be disposed on a carrier with bumps 142 contacting the carrier, and then the sheet is singulated through substrate 120 and encapsulant 140 using a water cutting tool, laser cutting tool, or saw blade to physically separate the plurality of packages 160.

A conductive material is deposited over packages 160 to form conformal shielding layer 162. Shielding layer 162 is formed by any suitable metal deposition technique, e.g., chemical vapor deposition, physical vapor deposition, other sputtering methods, spraying, or plating. Shielding layer 162 completely covers the exposed top and side surfaces of semiconductor die 104, encapsulant 140, and substrate 120. The singulation of the panel of packages 160 before forming shielding layer 162 exposes the side surfaces of each package so that the shielding layer is formed down the side surfaces to contact substrate 120. Shielding layer 162 physically and electrically contacts conductive layers 122, which can be used to connect the shielding layer to a ground voltage or other reference voltage node through a bump 142. Shielding layer 160 directly contacts back surface 108 of semiconductor die 104, which improves heat dissipation.

FIG. 3b illustrates semiconductor package 170 with shielding layer 172. Shielding layer 172 is similar to shielding layer 162 except that shielding layer 172 is formed over the top surface of package 170, but not over the side surfaces. Shielding layer 172 can be formed using a similar method to shielding layer 162, but with singulation occurring after forming the shielding layer rather than before. Packages 170 remain physically connected to each other in a sheet during formation of shielding layer 172, which blocks the shielding layer from covering side surfaces of the final device. Shielding layer 172 still covers the top of package 170 to reduce EMI and directly contacts semiconductor die 104 to dissipate heat.

FIG. 3c illustrates semiconductor package 180 with shielding layer 182. Shielding layer 182 is similar to shielding layers 162 and 172, but formed only on or over back surface 108 of semiconductor die 104 and not on encapsulant 140. In some embodiments, a photolithography masking layer is deposited over the sheet of packages and patterned to expose semiconductor die 104. When the mask is later removed, the metal layer is removed over encapsulant 140 along with the mask but remains over semiconductor die 104 as shielding layer 182. In other embodiments, strips of tape are used to cover encapsulant 140 between semiconductor die 104. Multiple perpendicularly aligned strips of tape can be used to cover encapsulant 140 on all four sides of semiconductor die 104, leaving the semiconductor die exposed for deposition of shielding layer 182.

FIGS. 4a-4e illustrate a method of processing semiconductor wafer 100 into semiconductor die 104 that is an alternative to FIGS. 1a-1c, and results in the semiconductor die having a shielding layer over side surfaces. FIG. 4a shows semiconductor wafer 100 with devices formed in active surface 110, but before formation of conductive layer 112. In FIG. 4b, trenches 200 are formed between each of the semiconductor die 104. Trenches 200 completely surround each semiconductor die. In the specific embodiment illustrated, semiconductor die 104 have four sides, and trenches 200 form a square around each semiconductor die. In other embodiments, semiconductor die 104 have more or less sides than four, and the shape of trenches 200 is modified to accommodate.

Trenches 200 are formed by deep reactive ion etching (DRIE), chemical etching, saw blades, or another suitable process. Trenches 200 only extend partially through wafer 100 so that semiconductor die 104 remain physically connected by semiconductor material 102 within saw streets 106. In other embodiments, trenches 200 extend completely through wafer 100 to singulate semiconductor die 104, and the relative positions of the semiconductor die are maintained by an adhesive material on a carrier.

In FIG. 4c, trenches 200 are filled with conductive material to form a shielding layer 202 surrounding each semiconductor die 104. Any suitable metal deposition technique can be used. Conductive layer 112 is formed before or after shielding layer 202 using any of the materials and methods discussed above. In other embodiments, conductive layer 112 is formed in the same metal deposition step as shielding layer 202. Conductive layer 112 optionally includes a conductive trace or other structure extending from a contact pad to physically and electrically contact shielding layer 202, which can be used to connect the shielding layer to a ground node for improved shielding. Bumps 114 are formed on contact pads of conductive layer 112 as described above.

In FIG. 4d, wafer 100 is flipped onto another carrier so that back surface 108 is presented. Back surface 108 is backgrinded to reduce a thickness of wafer 100 and expose shielding layer 202. Semiconductor material 102 over shielding layer 202 is removed by backgrinding or another suitable process. In FIG. 4e, semiconductor die 104 are singulated as in FIG. 1c. A portion of shielding layer 202 remains on each side surface of each semiconductor die 104 to completely surround the semiconductor die.

FIGS. 5a and 5b illustrate shielded packages formed using semiconductor die 104 in FIG. 4d with shielding layer 202. In FIG. 5a, semiconductor die 104 and discrete component 136 are disposed on substrate 120 as in FIG. 2b, and encapsulant 140 is deposited as in FIG. 2c. The top of shielding layer 202 is exposed from encapsulant 140 along with back surface 108 of semiconductor die 104. Shielding layer 162 is formed over the encapsulated semiconductor die 104. In FIG. 5a, shielding layer 162 is formed over top and side surfaces of the package, but conductive layer 112 does not contact shielding layer 202. Shielding layer 202 and 162 are both electrically connected to conductive layer 122 and a bump 142, which can be used to connect the shielding layers to ground.

In FIG. 5b, shielding layer 182 is formed over semiconductor die 104, but not over encapsulant 140. Shielding layer 182 can be electrically connected to a ground node through shielding layer 202, conductive layer 112, bumps 114, conductive layers 122, and bump 142. Shielding layers 202 and 182 in combination form a shield over the top and all side surfaces of semiconductor die 104. FIGS. 5a and 5b show two specific embodiments, but any of shielding layer 162, 172, or 182 can be used in conjunction with shielding layer 202, with or without conductive layer 112 being in contact with shielding layer 202.

Figure 6A:
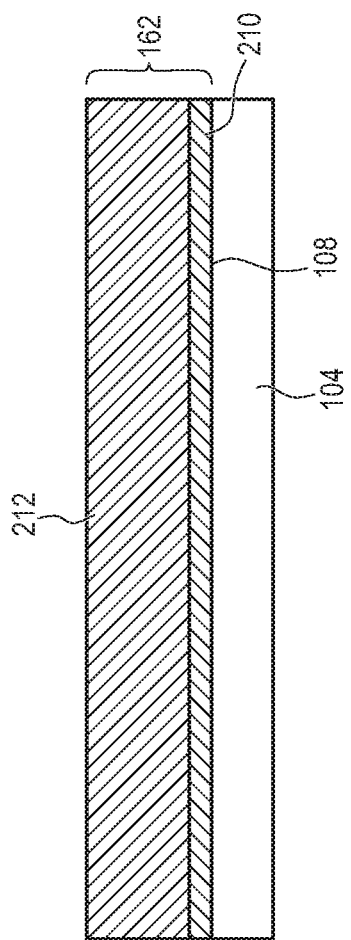
FIGS. 6a and 6b illustrate options for forming the shielding layer with multiple layers.
Figure 6B:
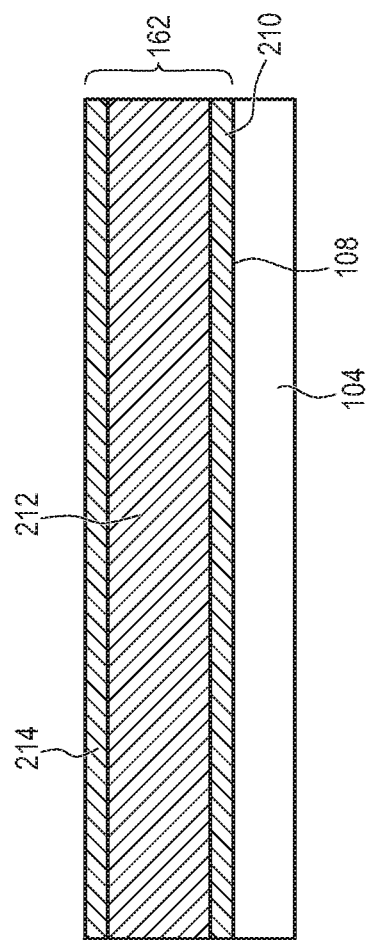

FIGS. 6a and 6b show shielding layer 162 optionally formed as a plurality of discrete layers. First, a stainless steel layer 210 is formed directly on semiconductor die 104, and encapsulant 140 if desired. Stainless steel layer 210 operates as an adhesion layer. Other suitable adhesion layer materials are used in other embodiments rather than stainless steel.

Copper layer 212 is formed on stainless steel layer 210. Copper layer 212 adheres firmly onto die 104 via stainless steel layer 210.

Copper layer 212 can remain as the top layer of shielding layer 162 as shown in FIG. 6a. Alternatively, a protection layer 214 can be formed over copper layer 212 as shown in FIG. 6b. Protection layer 214 can be another stainless steel layer, a nickel layer, an organic solderability preservative (OSP) layer, or another suitable protective layer. Stainless steel is a good solution for reducing cost, while nickel is a good choice because nickel can be sputtered on the surface of copper layer 212 using well developed methods and provides good oxidation prevention. The OSP treatment is an easy and low-cost copper surface protection solution. Protection layer 214 protects copper layer 212 from external physical impact as well as oxidation and other chemical reactions.

Alternatively, protection layer 214 can be a tin or lead based pre-soldering layer. Pre-solder can be applied using an easy solder paste printing method. In one embodiment, a tin-silver-copper (SnAgCu or SAC) solder paste or another tin-based material is used. Pre-solder is applied in embodiments where a heatsink or other component will subsequently be soldered onto the top of the shielding layer as shown below in FIGS. 7a-7f. Layers 210-214 are deposited using any suitable deposition techniques. The multi-layer structures shown in FIGS. 6a and 6b can be used for any of the shielding layers 162, 172, 182, and 202.

Figure 7A:
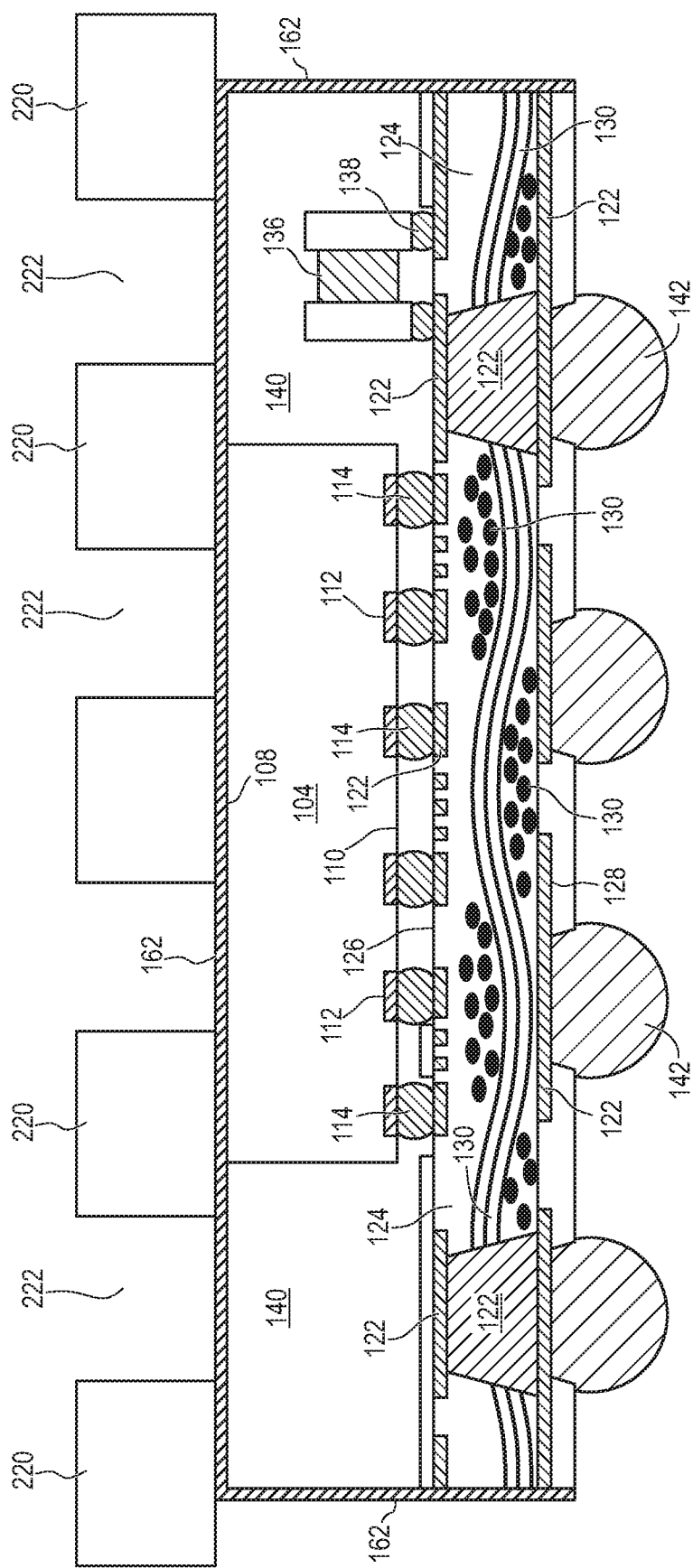
FIGS. 7a-7f illustrate adding a heat spreader over the EMI shielding layer.
Figure 7B:
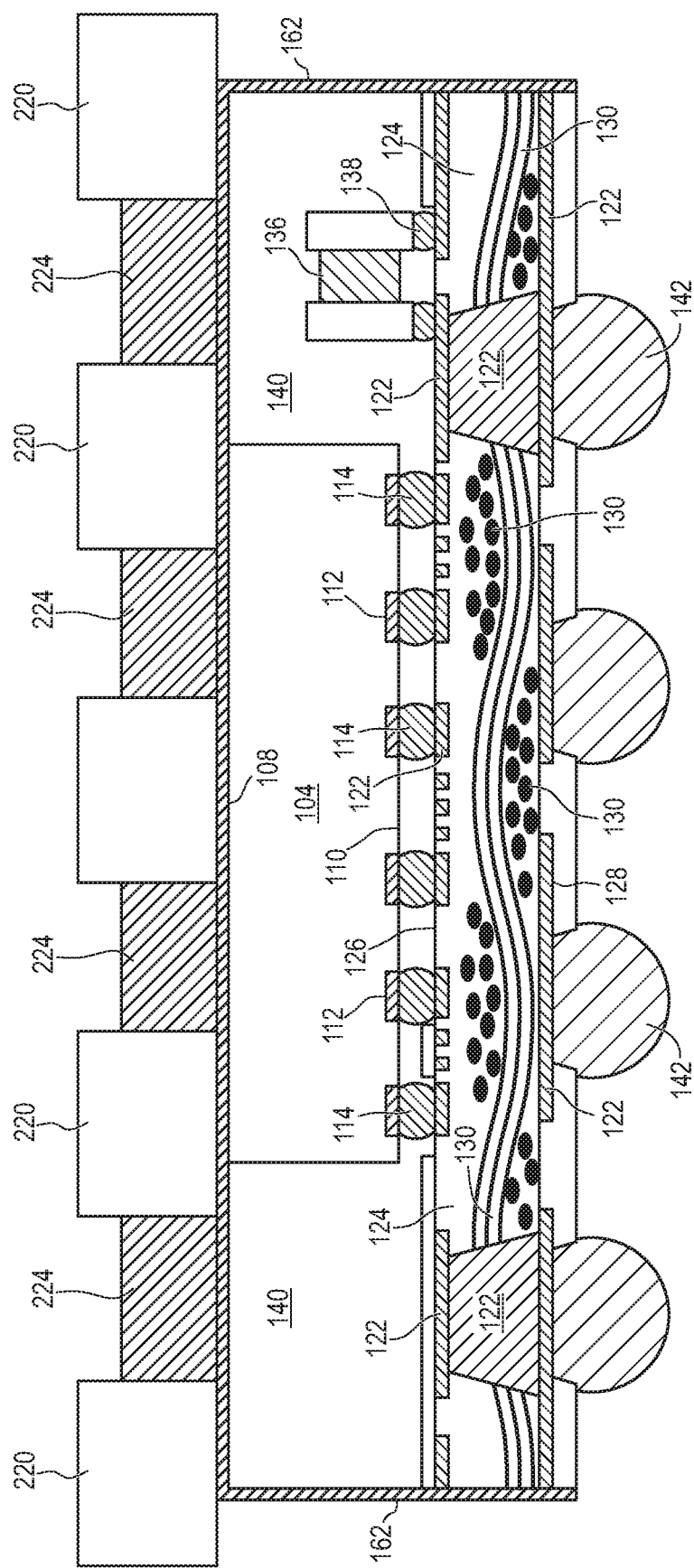

FIGS. 7a-7f illustrate adding a heatsink or heat spreader over the semiconductor packages. FIG. 7a shows package 160 from FIG. 3a. A masking layer 220 is formed over the top of the panel of packages 160. Masking layer 220 includes a plurality of openings 222 exposing shielding layer 162. In FIG. 7b, a solder or solder paste 224 is deposited or printed into openings 222 of masking layer 220. In some embodiments, shielding layer 162 has the multi-layer structure from FIG. 6b, with the top layer 214 being formed of a tin or lead based pre-solder to promote reflow and adhesion of solder 224.

Figure 7C:
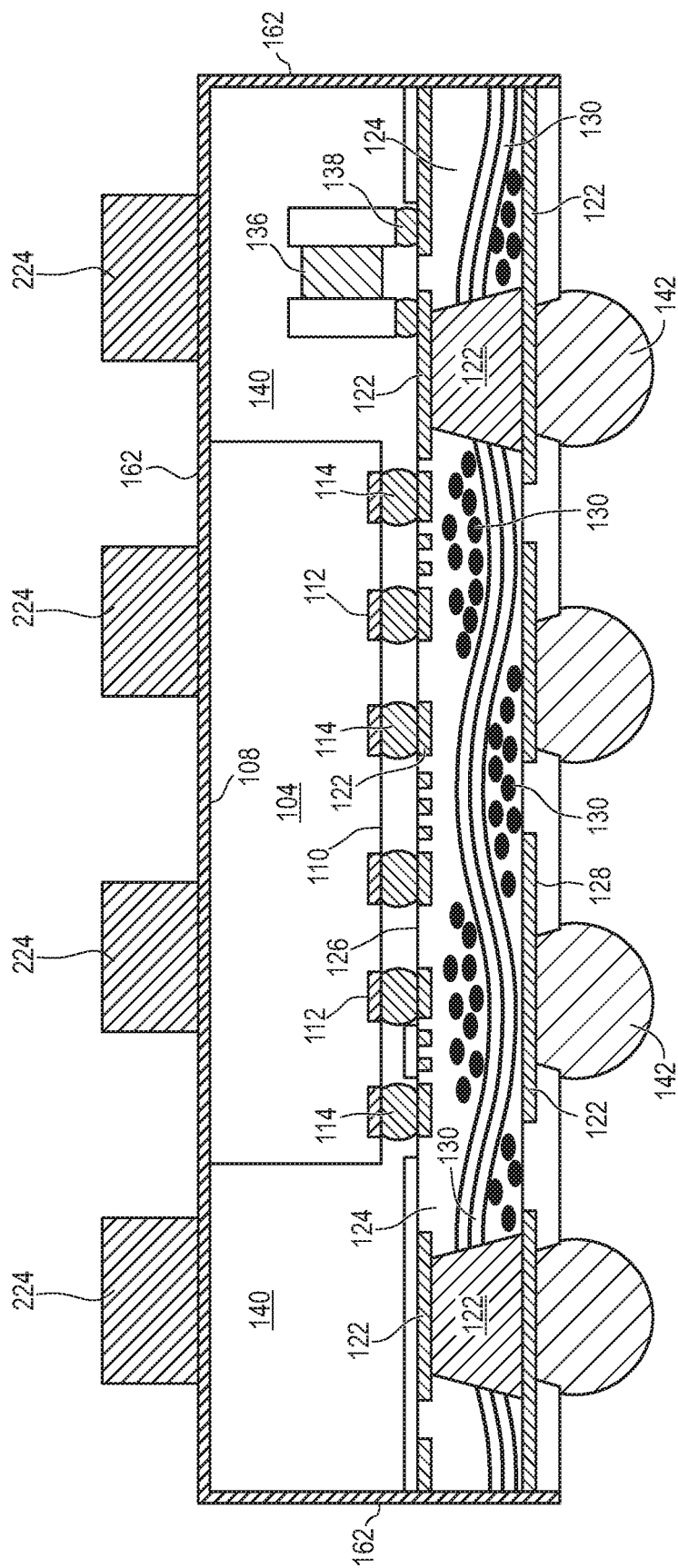
Figure 7D:
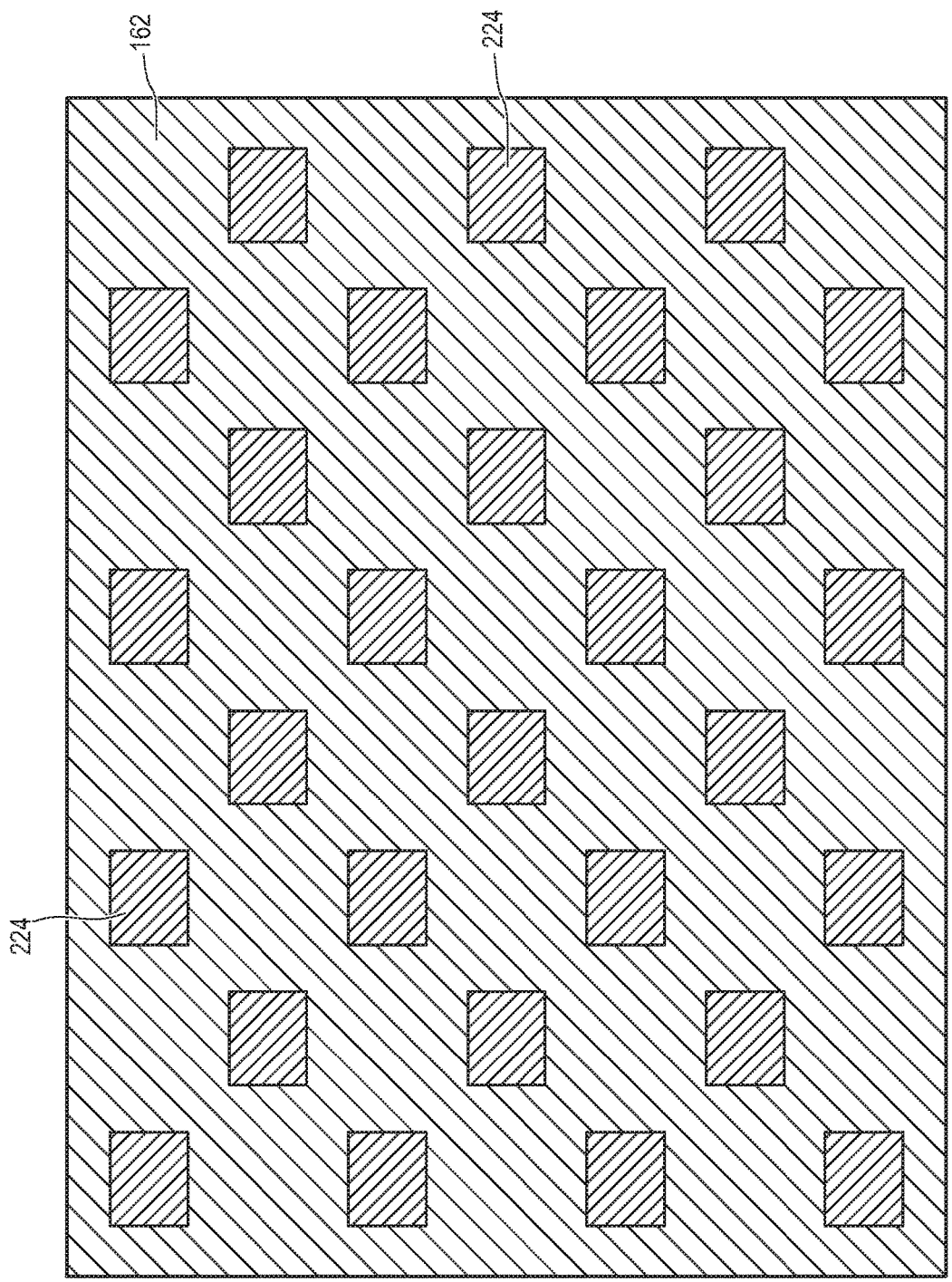
Figure 7E:
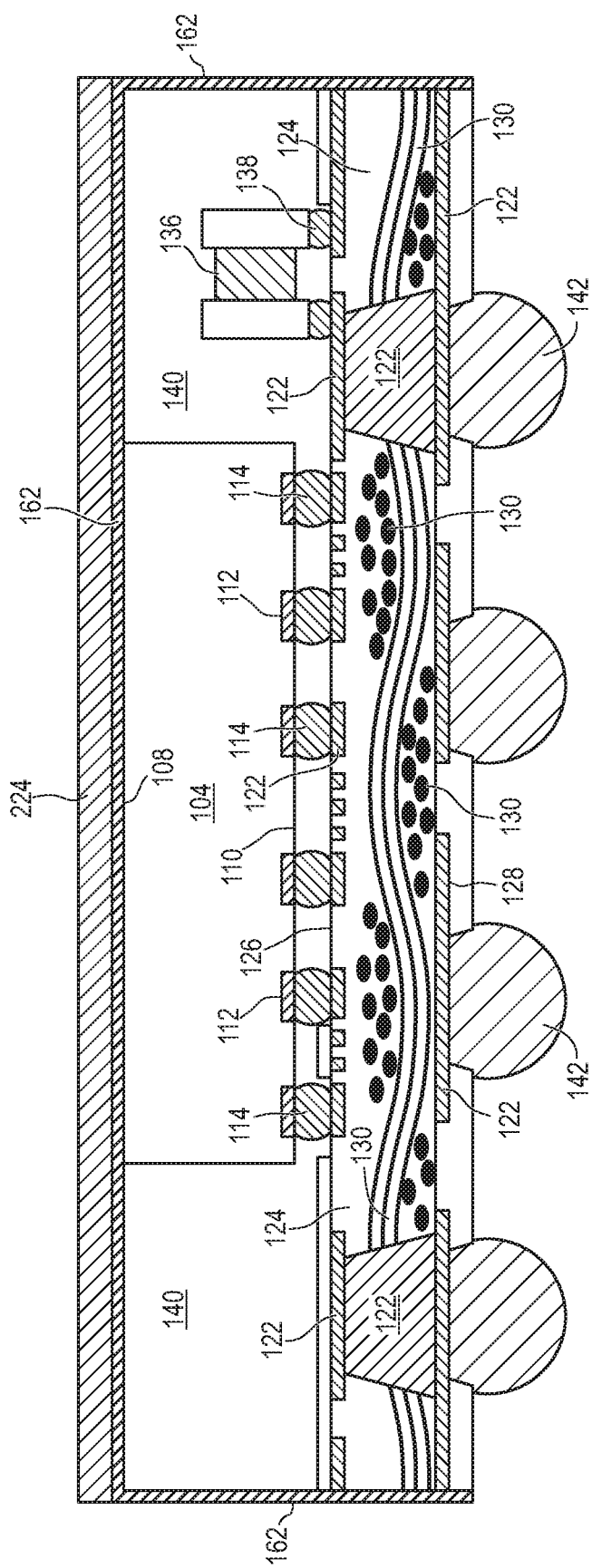

FIGS. 7c and 7d show package 160 with masking layer 220 removed after depositing solder 224. FIG. 7c is a cross-section, and FIG. 7d is a plan view. In FIG. 7e, solder 224 is melted down into a uniform layer that covers the top of package 160 on shielding layer 162. Solder 224 is deposited as a plurality of discrete portions and then melted into a single uniform layer to provide greater control of the total volume of solder applied, and therefore the final solder layer thickness. The thickness of solder printing can be challenging to deposit accurately for thin solder layers. Reducing the overall footprint of printed solder 224 using masking layer 220 increases the accuracy of the final thickness when melted in FIG. 7e. The final thickness of solder 224 in FIG. 7e will be proportionally related to the thickness of solder 224 in FIG. 7b, and also proportional to the total footprint of openings 222 in FIG. 7a.

Figure 7F:
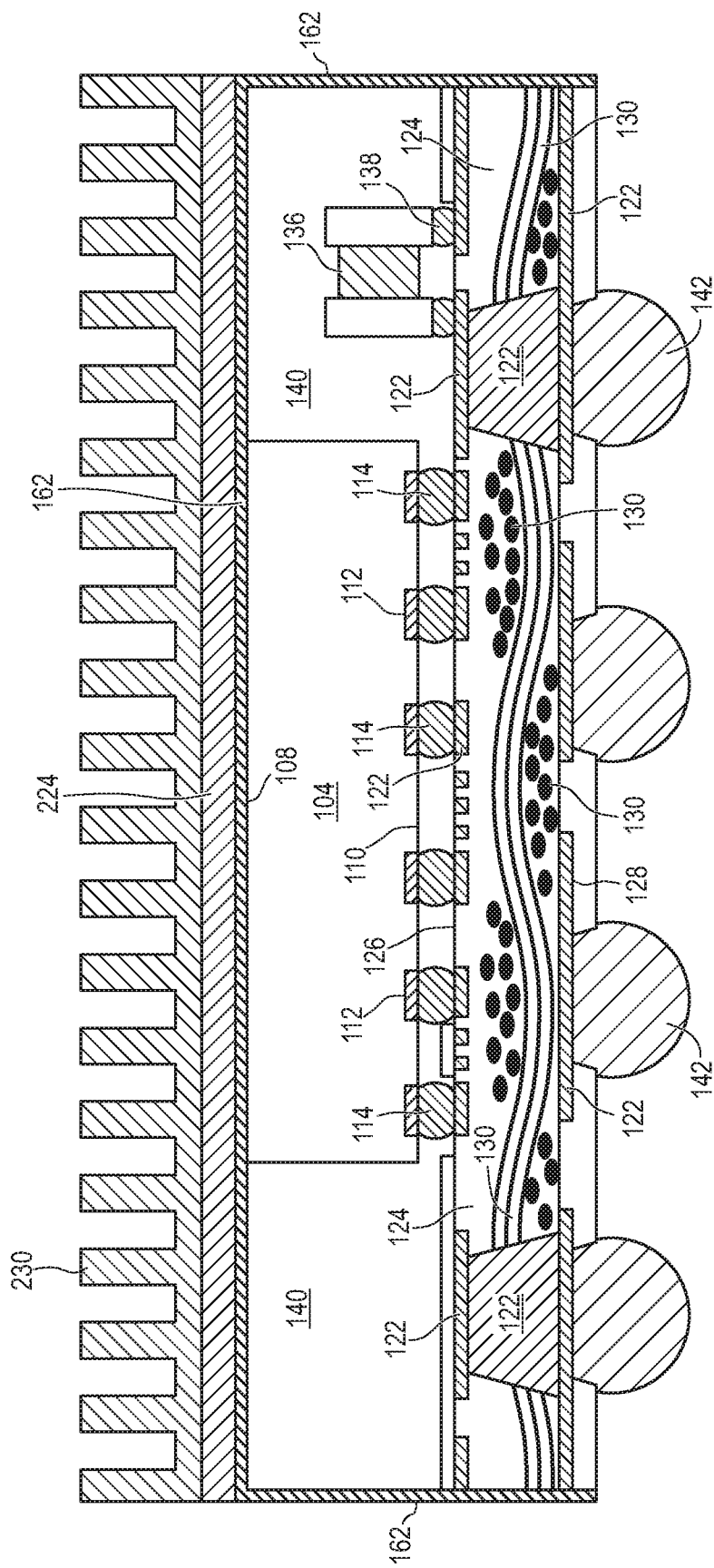

In FIG. 7f, a heatsink 230 is disposed on solder layer 224. Solder layer 224 is reflowed to mechanically, thermally, and electrically connect heatsink 230 to shielding layer 162. Thermal energy is efficiently transferred from semiconductor die 104 through shielding layer 162 and solder layer 224 to heatsink 230. Heatsink 230 includes fins to increase the overall surface area and therefore the rate of transfer of thermal energy into the surrounding environment. Heatsink 230 can be used with any of the above embodiments. For embodiments with the smaller shielding layer 182, heatsink 230 can be made smaller to have a similar footprint to the shielding layer.

Figure 8:
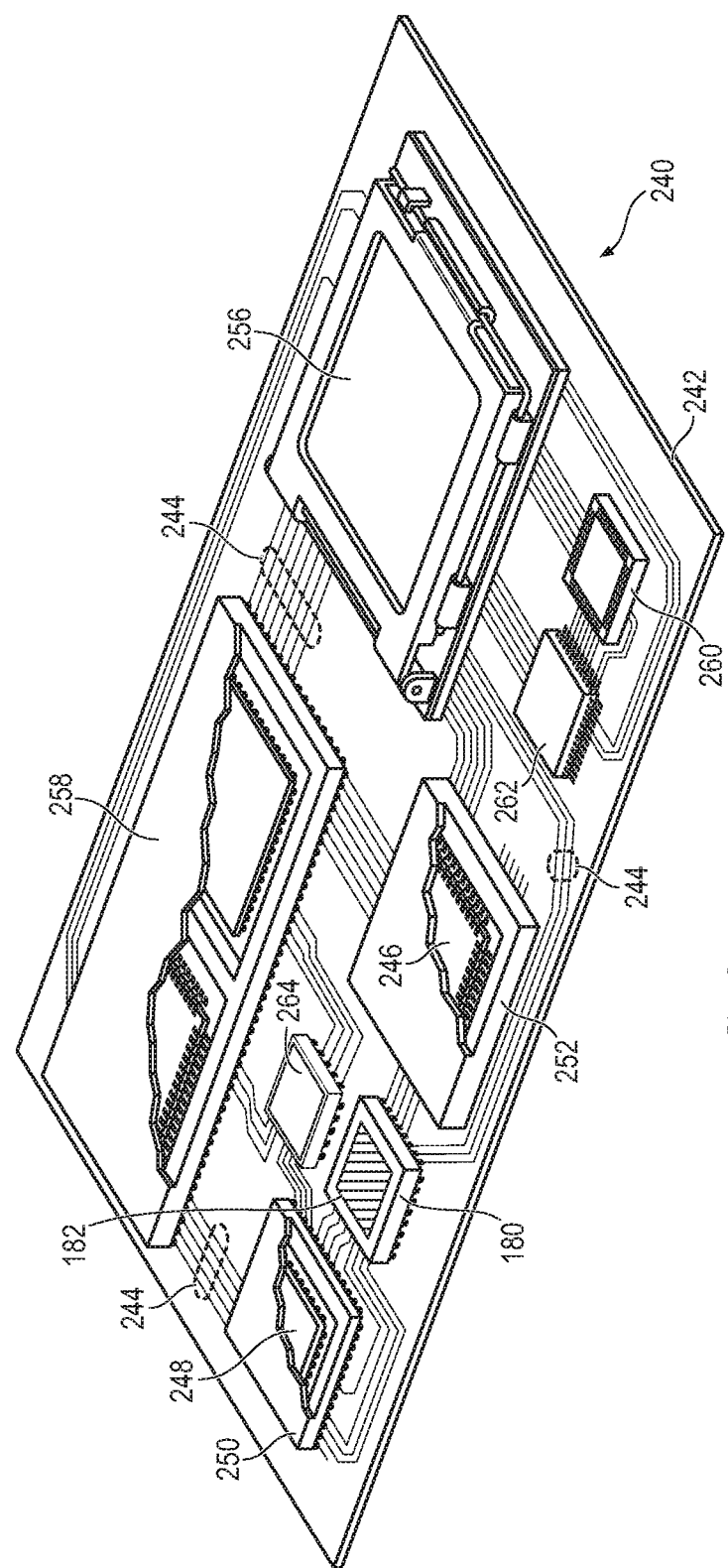
FIG. 8 illustrates a printed circuit board (PCB) with different types of packages mounted to a surface of the PCB.

FIG. 8 illustrates an electronic device 240 including PCB 242 with a plurality of semiconductor packages mounted on a surface of the PCB, including package 180 with shielding layer 182. Electronic device 240 can have one type of semiconductor package, or multiple types of semiconductor packages, depending on the application.

Electronic device 240 can be a stand-alone system that uses the semiconductor packages to perform one or more electrical functions. Alternatively, electronic device 240 can be a subcomponent of a larger system. For example, electronic device 240 can be part of a tablet computer, cellular phone, digital camera, communication system, or other electronic device. Electronic device 240 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 8, PCB 242 provides a general substrate for structural support and electrical interconnection of the semiconductor packages mounted on the PCB. Conductive signal traces 244 are formed over a surface or within layers of PCB 242 using evaporation, electrolytic plating, electroless plating, screen printing, or other suitable metal deposition process. Signal traces 244 provide for electrical communication between the semiconductor packages, mounted components, and other external systems or components. Traces 244 also provide power and ground connections to the semiconductor packages as needed. Package 180 is physically and electrically connected to PCB 242 by reflowing bumps 142 onto traces 244. In some embodiments, traces 244 including contact pads for mounting of package 180.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 242. In other embodiments, a semiconductor device may only have the first level packaging where the die is mechanically and electrically mounted directly to PCB 242.

For the purpose of illustration, several types of first level packaging, including bond wire package 246 and flipchip 248, are shown on PCB 242. Additionally, several types of second level packaging, including ball grid array (BGA) 250, bump chip carrier (BCC) 252, land grid array (LGA) 256, multi-chip module (MCM) 258, quad flat non-leaded package (QFN) 260, quad flat package 262, and embedded wafer level ball grid array (eWLB) 264 are shown mounted on PCB 242 along with package 180. Conductive traces 244 electrically couple the various packages and components disposed on PCB 242 to package 180, giving use of the components within the package to other components on the PCB.

Depending upon the system requirements, any combination of semiconductor packages, configured with any combination of first and second level packaging styles, as well as other electronic components, can be connected to PCB 242. In some embodiments, electronic device 240 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

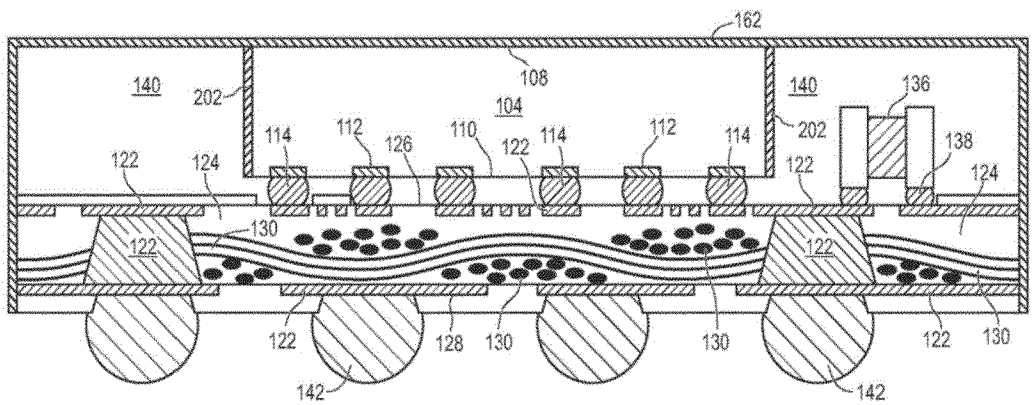

What is claimed:

1. A semiconductor device, comprising:
   a substrate comprising a conductive layer;
   a semiconductor die disposed over the substrate;
   an encapsulant deposited over the semiconductor die and substrate with a surface of the semiconductor die exposed from the encapsulant;
   a first shielding layer formed over the semiconductor die, wherein the first shielding layer includes a plurality of layers; and
   a second shielding layer formed over a side surface of the semiconductor die, wherein the first shielding layer and second shielding layer are electrically coupled to the conductive layer of the substrate.

2. The semiconductor device of claim 1, wherein the first shielding layer includes:
   a stainless steel layer in contact with the surface of the semiconductor die; and
   a copper layer formed over the stainless steel layer.

3. The semiconductor device of claim 2, wherein the first shielding layer further includes a protective layer formed over the copper layer.

4. The semiconductor device of claim 1, further including a solder layer formed over the first shielding layer.

5. The semiconductor device of claim 4, further including a heatsink bonded to the semiconductor die through the solder layer.

6. A semiconductor device, comprising:
   a semiconductor die;
   an encapsulant deposited over the semiconductor die;
   a first shielding layer formed on the semiconductor die, wherein the first shielding layer includes a plurality of layers; and
   a solder layer formed over the first shielding layer.

7. The semiconductor device of claim 6, wherein a surface of the encapsulant is coplanar with a surface of the semiconductor die.

8. The semiconductor device of claim 6, wherein the first shielding layer includes a first stainless steel layer.

9. The semiconductor device of claim 8, wherein the first shielding layer includes:
   a copper layer formed over the first stainless steel layer; and
   a second stainless steel layer formed over the copper layer.

10. The semiconductor device of claim 6, further including a second shielding layer formed on a side surface of the semiconductor die.

11. The semiconductor device of claim 10, further including a conductive trace coupled between a contact pad of the semiconductor die and the second shielding layer.

12. The semiconductor device of claim 6, further including a heatsink disposed over the solder layer.

13. A method of making a semiconductor device, comprising:
   providing a semiconductor die;
   depositing an encapsulant over the semiconductor die, wherein a surface of the semiconductor die is exposed from the encapsulant;
   forming a shielding layer over the surface of the semiconductor die, wherein the shielding layer includes a plurality of layers;
   disposing a masking layer over the shielding layer;
   depositing a solder paste in an opening of the masking layer;
   removing the masking layer; and
   reflowing the solder paste after removing the masking layer.

14. The method of claim 13, further including disposing a heatsink over the solder paste.

15. The method of claim 13, further including:
   providing a semiconductor wafer including the semiconductor die;
   forming a trench in the semiconductor wafer adjacent to the semiconductor die;
   depositing a conductive material into the trench; and
   singulating the semiconductor die from the semiconductor wafer through the trench after depositing the conductive material.

16. The method of claim 15, further including forming a conductive trace over the semiconductor die and connected to the conductive material.

17. The method of claim 13, further including depositing the encapsulant using film assisted molding.

18. A method of making a semiconductor device, comprising:
   providing a semiconductor die;
   forming a second shielding layer over a side surface of the semiconductor die;
   depositing an encapsulant over the semiconductor die and second shielding layer, wherein a surface of the encapsulant is coplanar with a surface of the second shielding layer and a back surface of the semiconductor die are electrically coupled to the conductive layer of the substrate; and
   forming a first shielding layer over the surface of the semiconductor die after depositing the encapsulant, wherein the first shielding layer includes a plurality of layers.

19. The method of claim 18, further including forming the first shielding layer to include a plurality of layers.

20. The method of claim 18, further including mounting a heatsink to the first shielding layer.

21. The method of claim 18, further including coupling the second shielding layer to a contact pad of the semiconductor die.

22. The method of claim 18, further including forming a protective layer over the first shielding layer.

* * * * *

UNITED STATES PATENT AND TRADEMARK OFFICE
CERTIFICATE OF CORRECTION

PATENT NO. : 10,804,217 B2
APPLICATION NO. : 16/529486
DATED : October 13, 2020
INVENTOR(S) : SungWon Cho et al.

It is certified that error appears in the above-identified patent and that said Letters Patent is hereby corrected as shown below:

On the Title Page

Under ABSTRACT "22 Claims, 15 Drawing Sheets" should read: 21 Claims, 15 Drawing Sheets, as shown on the attached page.

In the Claims

Column 10, Claim 18, Lines 42-44, delete the words, "are electrically coupled to the conductive layer of the substrate".

Column 10, Claim 18, Line 45, insert the word, -- back -- before the word, "surface".

Column 10, Lines 49-50, Delete Claim 19 in its entirety.

Column 10, Lines 51-57, Renumber the Claims 20, 21 and 22 as follows:

19. The method of claim 18, further including mounting a heatsink to the first shielding layer.

20. The method of claim 18, further including coupling the second shielding layer to a contact pad of the semiconductor die.

21. The method of claim 18, further including forming a protective layer over the first shielding layer.

Signed and Sealed this
Ninth Day of August, 2022

Katherine Kelly Vidal
*Director of the United States Patent and Trademark Office*

(12) United States Patent
Cho et al.

(10) Patent No.: US 10,804,217 B2
(45) Date of Patent: Oct. 13, 2020

(54) EMI SHIELDING FOR FLIP CHIP PACKAGE WITH EXPOSED DIE BACKSIDE

(71) Applicant: STATS ChipPAC Pte. Ltd., Singapore (SG)

(72) Inventors: SungWon Cho, Seoul (KR); ChangOh Kim, Incheon (KR); Il Kwon Shim, Singapore (SG); InSang Yoon, Seoul (KR); KyoungHee Park, Seoul (KR)

(73) Assignee: STATS ChipPAC Pte. Ltd., Singapore (SG)

(*) Notice: Subject to any disclaimer, the term of this patent is extended or adjusted under 35 U.S.C. 154(b) by 0 days.

(21) Appl. No.: 16/529,486

(22) Filed: Aug. 1, 2019

(65) Prior Publication Data
US 2020/0051926 A1  Feb. 13, 2020

Related U.S. Application Data

(60) Provisional application No. 62/717,415, filed on Aug. 10, 2018.

(51) Int. Cl.
*H01L 27/14*  (2006.01)
*H01L 21/00*  (2006.01)
*H01L 23/552*  (2006.01)
*H01L 23/00*  (2006.01)
*H01L 23/36*  (2006.01)
(Continued)

(52) U.S. Cl.
CPC ........ *H01L 23/552* (2013.01); *H01L 23/3107* (2013.01); *H01L 23/36* (2013.01); *H01L 23/49816* (2013.01); *H01L 23/50* (2013.01); *H01L 23/5225* (2013.01);
(Continued)

(58) Field of Classification Search
CPC ....... H01L 23/552; H01L 24/26; H01L 23/36; H01L 23/50; H01L 23/49816; H01L 2924/3025; H01L 2924/15311; H01L 23/31; H01L 23/60; H01L 23/3107; H01L 23/562; H01L 27/0248
See application file for complete search history.

(56) References Cited

U.S. PATENT DOCUMENTS 10,256,195 B2 *  4/2019  Yamamoto ............ H01L 23/552
10,455,748 B2 * 10/2019  Yamamoto ................ B32B 7/12
(Continued)

OTHER PUBLICATIONS

"EMI Shielding for Die Backside Exposed Flip Chip Package", ip.com, Jun. 12, 2017.

*Primary Examiner* — Alonzo Chambliss
(74) *Attorney, Agent, or Firm* — Brian M. Kaufman; Robert D. Atkins; Patent Law Group: Atkins and Associates, P.C.

(57) ABSTRACT

A semiconductor device has a substrate and a semiconductor die disposed over the substrate. An encapsulant is deposited over the semiconductor die and substrate with a surface of the semiconductor die exposed from the encapsulant. A first shielding layer is formed over the semiconductor die. In some embodiments, the first shielding layer includes a stainless steel layer in contact with the surface of the semiconductor die and a copper layer formed over the stainless steel layer. The first shielding layer may further include a protective layer formed over the copper layer. One embodiment has a heatsink bonded to the semiconductor die through a solder layer. A second shielding layer can be formed over a side surface of the semiconductor die.

21 Claims, 15 Drawing Sheets